United States Patent
Baldwin et al.

(10) Patent No.: US 8,513,105 B2
(45) Date of Patent: Aug. 20, 2013

(54) FLEXIBLE INTEGRATION OF LOGIC BLOCKS WITH TRANSISTORS OF DIFFERENT THRESHOLD VOLTAGES

(75) Inventors: Gregory Charles Baldwin, Plano, TX (US); James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 71 days.

(21) Appl. No.: 12/904,918

(22) Filed: Oct. 14, 2010

(65) Prior Publication Data

US 2012/0091531 A1    Apr. 19, 2012

(51) Int. Cl.
*H01L 21/3205*  (2006.01)
*H01L 21/4763*  (2006.01)

(52) U.S. Cl.
USPC ........... 438/587; 438/525; 438/585; 438/942; 257/E21.632

(58) Field of Classification Search
USPC .................. 438/197, 199, 424, 514, 525, 531, 438/585, 587, 942, FOR. 221, FOR. 227; 257/E27.046, E27.108, E21.632
See application file for complete search history.

(56) References Cited

U.S. PATENT DOCUMENTS

| | | | | |
|---|---|---|---|---|
| 5,972,783 | A * | 10/1999 | Arai et al. | 438/513 |
| 7,811,876 | B2 * | 10/2010 | Scott et al. | 438/199 |
| 2007/0015332 | A1 * | 1/2007 | Hemink et al. | 438/257 |
| 2009/0124069 | A1 * | 5/2009 | Clark et al. | 438/525 |
| 2009/0305471 | A1 * | 12/2009 | Chang et al. | 438/154 |
| 2009/0321850 | A1 * | 12/2009 | Griebenow et al. | 257/392 |
| 2009/0325355 | A1 * | 12/2009 | Poock et al. | 438/302 |
| 2010/0167472 | A1 * | 7/2010 | Gu et al. | 438/142 |
| 2011/0127588 | A1 * | 6/2011 | Cheng et al. | 257/288 |
| 2011/0195548 | A1 * | 8/2011 | Yeh et al. | 438/199 |

* cited by examiner

*Primary Examiner* — Michelle Mandala
(74) *Attorney, Agent, or Firm* — Jacqueline J. Garner; Wade J. Brady, III; Frederick J. Telecky, Jr.

(57) ABSTRACT

An integrated circuit constructed according to an arrangement of logic blocks, with one or more logic blocks including transistors of a different threshold voltage than in other logic blocks. Spacing between neighboring active regions of different threshold voltages is minimized by constraining the angle of implant for the threshold adjust implant, and by constraining the thickness of the mask layer used with that implant. These constraints ensure adequate implant of dopant into the channel region while blocking the implant into channel regions not subject to the threshold adjust, while avoiding shadowing from the mask layer. Efficiency is attained by constraining the direction of implant to substantially perpendicular to the run of the gate electrodes in the implanted regions.

14 Claims, 8 Drawing Sheets

FLEXIBLE INTEGRATION OF LOGIC BLOCKS WITH TRANSISTORS OF DIFFERENT THRESHOLD VOLTAGES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are directed to metal-oxide-semiconductor (MOS) integrated circuits constructed with transistors of multiple threshold voltages.

An important parameter in defining the operation and performance of a MOS transistor is its threshold voltage ($V_t$). As fundamental in the art, the MOS transistor threshold voltage determines the gate-to-source voltage required to turn on the device (i.e., to conduct source/drain current) as well as the level of source/drain current for a given gate-to-source voltage when turned on. In a general sense, an enhancement mode MOS transistor with a low threshold voltage will switch faster but consume more power than will a similar transistor with a higher threshold voltage.

In modern electronic systems, particularly in portable and thus battery-powered systems such as wireless telephone handsets, power consumption is a significant concern. On the other hand, it is of course desirable to maximize system performance. Selection of the MOS transistor threshold voltage is thus a critical factor in achieving the desired performance level while not exceeding power constraints. The desired threshold voltage is implemented, in many cases, by ion implantation of a selected concentration of dopant into the eventual transistor channel regions. In complementary-MOS ("CMOS") integrated circuits, this threshold voltage adjust implant may be performed for both n-channel and p-channel MOS transistors.

Many modern logic integrated circuits are constructed as multiple logic "blocks", each block being an array or other arrangement of transistors available for interconnection at higher metal levels to realize a desired logic function. Some circuit blocks correspond to so-called "standard cells", which are circuit blocks implementing commonly-used functions, ranging from logical primitives to entire processor cores. Considering the performance vs. power tradeoff discussed above, conventional block-based logic circuits are now commonly implemented with some blocks of low threshold voltage transistors and other blocks of higher threshold voltage devices. In this way, performance-critical circuits can be constructed using low-$V_t$ devices that switch rapidly and conduct strongly, while non-critical-path devices can be constructed with higher threshold voltage devices to reduce the overall power consumption of the circuit.

In conventional manufacturing flows, at least the low $V_t$ blocks, if not also the higher standard $V_t$ blocks, receive the threshold adjust implant. For CMOS circuits, low $V_t$ and high $V_t$ blocks may be realized for both n-channel and p-channel transistors. Masked threshold adjust implants differentiate the low $V_t$ and standard $V_t$ blocks, with photoresist or another mask material protecting the regions of the integrated circuit that are not to receive a particular implant. From a layout perspective, additional space between devices of different threshold voltage for the implant mask pattern and the corresponding $V_t$ adjust implant itself is conventionally provided to ensure that the $V_t$ adjust implant reaches one block but not its neighbor.

FIGS. 1a and 1b illustrate, in plan view and in cross-sectional view, the spacing requirement in conventional integrated circuits between a logic block that is to receive a certain threshold adjust implant and a logic block that is to not receive that implant. In the integrated circuit of FIG. 1a, CMOS logic blocks are arranged in rows 10 and columns 11 in an array. Each row 10 of logic blocks includes both an n-type active region 4n and a p-type active region 4p. For example, a CMOS logic block in row 10(k) and column 11(j) of FIG. 1a includes n-type active region 4n' and p-type active region 4p'. P-type active regions 4p are disposed within n-type well region 2, and n-type active regions 4n are disposed within p-type substrate 14 (FIG. 1b), in this single-well example. Alternatively, of course, a twin-well process could be used, in which case n-type active regions 4n would be disposed within a p-type well. In any case, the bounds of active regions 4n, 4p are determined by isolation structures 15 (FIG. 1b).

Polysilicon gate electrodes 6g overlie each of the active regions 4n, 4p, with those active regions 4n, 4p in the same CMOS logic block sharing a common gate electrode 6g. As known in the art, active regions 4n, 4p refer to regions of the surface of the substrate or well at which transistor source and drain regions can be formed, generally in a self-aligned manner relative to polysilicon gate electrode 6g. For example, active region 4p' is p-type by virtue of a source/drain ion implantation and anneal performed after the formation of polysilicon gate electrodes 6g; the channel portion of the active region underlying gate electrode 6g will remain n-type in active region 4p, and p-type in active region 4n.

Circuits can be formed within a given logic block by the placement of contacts CT and the routing of metal interconnects (not shown) to those contacts CT. FIG. 1a illustrates an example of the formation of a CMOS inverter in the logic block of row 10(k) and column 11(j). Contacts CT are formed through the overlying insulator layer to locations on either side of gate electrode 6g' in active region 4p', and also on either side of gate electrode 6g' in active region 4n'. These contacts-to-active serve as connections to the source and drain of each of an n-channel and a p-channel transistor that share a common gate electrode 6g'. Another contact CT is made to gate electrode 6g' itself, to serve as the input of the CMOS inverter; conversely, a metal conductor connection to the contacts CT at the drain of these transistors serves as the inverter output. Similarly, other CMOS circuits can be constructed by the placement of contacts CT and the routing of metal conductors to those contacts CT, as is well known in the art.

In the integrated circuit of FIGS. 1a and 1b, as in many modern integrated circuits having extremely small (e.g., sub-micron) minimum feature sizes, it is useful to photolithographically pattern and form certain elements with a great degree of regularity across the surface of the integrated circuit. This is evident in FIG. 1a by the routing of polysilicon gate electrodes 6g of constant width in the same direction, and at a relatively constant spacing, within each logic block. This regularity is commonly enforced by constraining the pitch (width plus spacing) of gate electrodes 6g relative to one another to within a relatively narrow range. For example, in modern deep submicron technologies in which gate electrode widths are on the order of 0.25 to 0.30 µm, the gate electrode pitch may be constrained to be within 114 nm to 128 nm.

This regularity, enforced by gate electrode pitch constraints, is also maintained between columns 11 of logic blocks by polysilicon elements 6c disposed between adjacent active regions 4p, 4n, and that overlie isolation structures 15 (FIG. 1b). These elements 6c have the same width and spacing as gate electrodes 6g, but are not electrically connected. By maintaining a generally constant feature pitch in this region of the integrated circuit, elements 6c assist in the patterning of gate electrodes 6g of uniform width and spacing, and thus the formation of transistors of matched electrical characteristics. Polysilicon elements 6c are of course formed simultaneously with gate electrodes 6g.

In this conventional example, certain logic blocks are to be formed with a lower threshold voltage than those in adjacent logic blocks. This is shown in FIG. 1a by active regions 4p', 4p'', 4n', 4n'' in column 11(j), which are to be made available for low-$V_t$ transistors. In this conventional case, the lower threshold voltage is to be defined by a $V_t$ adjust ion implant (i.e., "pocket" implant) that is performed after the formation of gate electrodes 6g; FIG. 1a illustrates region 13 that receives this low-$V_t$ adjust implant. Conversely, adjacent active regions 4n in columns 11(j−1), 11(j+1) on either side of active regions 4n', 4n'' in column 11(j) will be formed as "standard $V_t$" regions, which will receive a different $V_t$ adjust implant or is alternatively defined by a "blanket" implant prior to formation of gate electrodes 6g. Similarly, adjacent active regions 4p in columns 11(j−1), 11(j+1) on either side of active regions 4p', 4p'' in column 11(j) will be formed as "standard $V_t$" regions; active regions 4p', 4p'' in column 11(j) will receive a $V_t$ adjust implant to reduce the threshold voltage of p-channel transistors in those regions.

As evident from FIG. 1a, an extended distance D is provided between the low-$V_t$ n-type active regions 4p', 4p'', 4n', 4n'' and their adjacent n-type regions 4p, 4n in standard-$V_t$ logic blocks. In this conventional approach, this extended distance D is necessary to allow the $V_t$ adjust implant to reach the channel regions underlying gate electrodes 6g in active regions 4p', 4p'', 4n', 4n'', while still masking that implant from the standard $V_t$ active regions 4p, 4n on either side of these low-$V_t$ regions. In addition, this distance D is constrained to correspond to an integral number of pitch intervals of polysilicon elements 6c between gate electrodes 6g. In this conventional case, because the minimum spacing required for allowing the $V_t$ adjust implant to reach the channel regions while still attaining good masking is greater than two polysilicon pitch intervals (e.g., of 114 nm to 128 nm each), the constraint of constant gate electrode pitch requires that two polysilicon structures 6c be placed between standard-$V_t$ and low $V_t$ logic blocks.

FIG. 1b illustrates the structure of FIG. 1a in cross-section, at a point in its manufacture at which the low-$V_t$ adjust implant is being performed. In this example, photoresist mask 12 is disposed over active regions 4n in the standard $V_t$ regions. Also in this example, as is conventional, the $V_t$ adjust implants are performed at a relatively large angle φ from the vertical, either by way of an angled implant or a rotating disk implant; this large angle φ facilitates implant of dopant into the channel region underlying gate electrode 6g and gate dielectric 9. However, in order for photoresist mask 12 to be effective in blocking the implant into its channel regions (especially into the first device on the opposite side of active region 4n'), mask 12 must be of an adequate thickness H. Geometrically, as shown in FIG. 1b, the angle φ of the implant coupled with the thickness H of photoresist mask 12 determines the minimum distance required between adjacent logic blocks; as discussed above, the actual distance D is constrained by the constant pitch interval requirement, such that the distance between the closest gate electrodes 6g in adjacent logic blocks is an integral number of gate electrode pitch intervals. This distance D is, of course, wasted space from a circuit density standpoint, as the corresponding chip area cannot be used for any active circuitry. So long as the number and placement of the low-$V_t$ logic blocks is known in advance, the number of instances of this extended distance D can be minimized. This is because adjacent logic blocks containing transistors of the same threshold voltage can be placed much more closely together, essentially limited only by the minimum isolation structure width required to isolate the neighboring active regions from one another.

Unfortunately, it has been observed in connection with this invention that, at the time of device layout in many block-oriented integrated circuits, the designer does not yet know which logic blocks will become the limiting path from the standpoint of performance, nor which logic blocks will dominate the overall power consumption of the integrated circuit. In other words, the designer may not be able to select which circuit functions are to be implemented in low-$V_t$ blocks and which ought to be implemented in high-$V_t$ blocks, at the time of layout. While it is possible to change the $V_t$ adjust implant for a given block by changing the appropriate implant mask patterns, the spacing requirements between logic blocks having different threshold voltage transistors must be satisfied. Accordingly, in order to provide maximum flexibility in the assignment of threshold voltages to logic blocks, conventional integrated circuit layouts must implement the necessary spacing on the sides of all logic blocks that may potentially receive a different threshold adjust implant from that of its neighbor. Conversely, conserving chip area by limiting the number of potential low $V_t$ blocks (thus providing fewer instances of the additional spacing) constrains design flexibility, and limits the optimization of performance and power. This additional space is of course wasted in those cases in which adjacent blocks receive the same threshold adjust implant.

BRIEF SUMMARY OF THE INVENTION

Embodiments of this invention provide an integrated circuit with multiple threshold voltage transistors, and a method of fabricating the same, that more efficiently utilizes chip area for the integrated circuit.

Embodiments of this invention further provide such an integrated circuit and corresponding method that are compatible with conventional integrated circuit manufacturing processes.

Embodiments of this invention further provide such an integrated circuit and method that provide additional flexibility in the selection of threshold voltage for individual logic blocks.

Embodiments of this invention further provide such an integrated circuit and method in which selection of the device threshold voltage can be made after layout, characterization, and evaluation of actual devices.

Other objects and advantages of this invention will be apparent to those of ordinary skill in the art having reference to the following specification together with its drawings.

This invention may be implemented into a method of fabricating an integrated circuit, and an integrated circuit manufactured by that method, in which the threshold adjust ion implantation is constrained to reduce the spacing required between circuit blocks of different threshold voltage. The height of the photoresist mask for a low $V_t$ adjust implant performed after gate formation is limited to prevent angled implant shadowing; the angle of the implant from the vertical is also limited. In addition, the threshold adjust implant is constrained to be largely perpendicular to the transistor gate of the adjusted transistors, improving the efficiency of the implant in reaching the channel region under the transistor gate. These constraints on the threshold adjust implant enable close spacing of adjacent low $V_t$ and high $V_t$ transistor blocks, and improves the flexibility of layout and of threshold voltage selection in the eventual integrated circuit.

DETAILED DESCRIPTION OF THE INVENTION

This invention will be described in connection with one or more of its embodiments, namely as implemented into a complementary metal-oxide-semiconductor (CMOS) integrated circuit, because it is contemplated that this invention will be especially beneficial in such an application. However, it is also contemplated that this invention may provide advantages and benefits in other integrated circuit applications. Accordingly, it is to be understood that the following description is provided by way of example only, and is not intended to limit the true scope of this invention as claimed.

Figure 2:
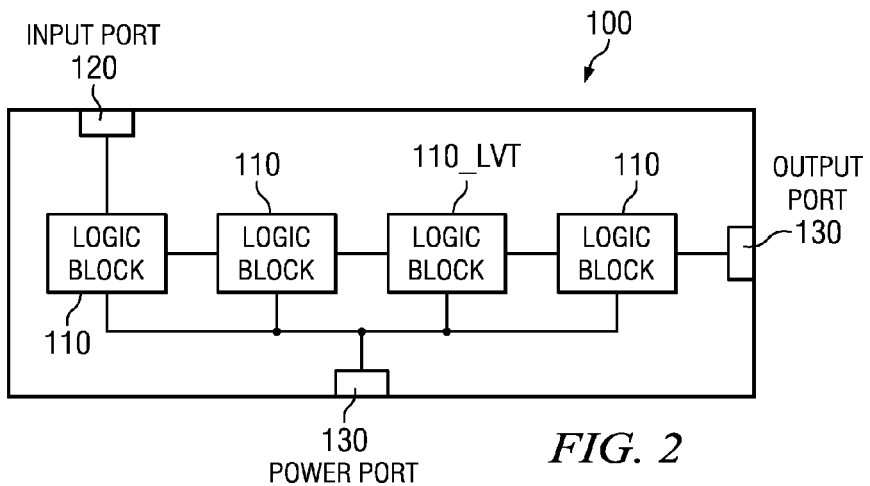
FIG. 2 is an electrical diagram, in block form, of an application specific integrated circuit constructed according to embodiments of this invention.

FIG. 2 illustrates, in block diagram form, an application specific integrated circuit (ASIC) 100 constructed according to an example of embodiments of this invention. Of course, the particular architecture of ASIC 100 may vary widely from that illustrated in FIG. 2, as ASIC 100 is presented by way of example and to provide context for the embodiments of this invention. In this example, ASIC 100 includes multiple logic blocks 110 that are coupled together to realize the desired overall function of ASIC 100. In addition to logic blocks 110, ASIC 100 generally includes input port 120 coupled to one or more of logic blocks 110, output port 130 coupled to one or more logic blocks 110, and power port 140 coupled to each of logic blocks 110 in this example. An external power source, such as a battery or voltage regulator circuit, may provide power to ASIC 100 via power port 140. As is conventional in the art, input port 120 and output port 130 are configured to provide external signal access to and from logic blocks 110, and as such, typically include pads or other physical terminals for providing connection to external circuitry, as typical in the art. ASIC 100 may, of course, include additional components and circuit functions beyond those shown in the example of FIG. 2, whether arranged within a logic block 110 or by way of other dedicated digital or analog circuits.

As discussed above, the designer of integrated circuits such as ASIC 100 may determine, through simulation or by evaluating actual integrated circuits, that one or more of logic blocks 110 limits the performance of ASIC 100, or dominates its power consumption. As such, the designer may determine that the performance and power consumption of ASIC 100 can be optimized by realizing one or more of logic blocks 110 by transistors with a lower threshold voltage than the standard threshold voltage in other logic blocks 110. For example, a logic block 110 in the critical timing path of ASIC 100 can be realized by lower threshold voltage transistors to improve its switching performance, while the other logic blocks 110 may be realized by transistors with the standard threshold voltage to minimize power consumption. For whatever reason, logic block 110_LVT in ASIC 100 of FIG. 2 in this example has been determined to be realized by way of low threshold voltage transistors, with the other logic blocks 110 to be realized by standard threshold voltage transistors. This low $V_t$ construction of logic block 110_LVT in this embodiment of the invention will be implemented by way of a special $V_t$ adjust ion implantation, implanting dopant ions of the desired species and dose into the channel region underlying the gate electrodes of transistors in that logic block 110_LVT.

Figure 3:
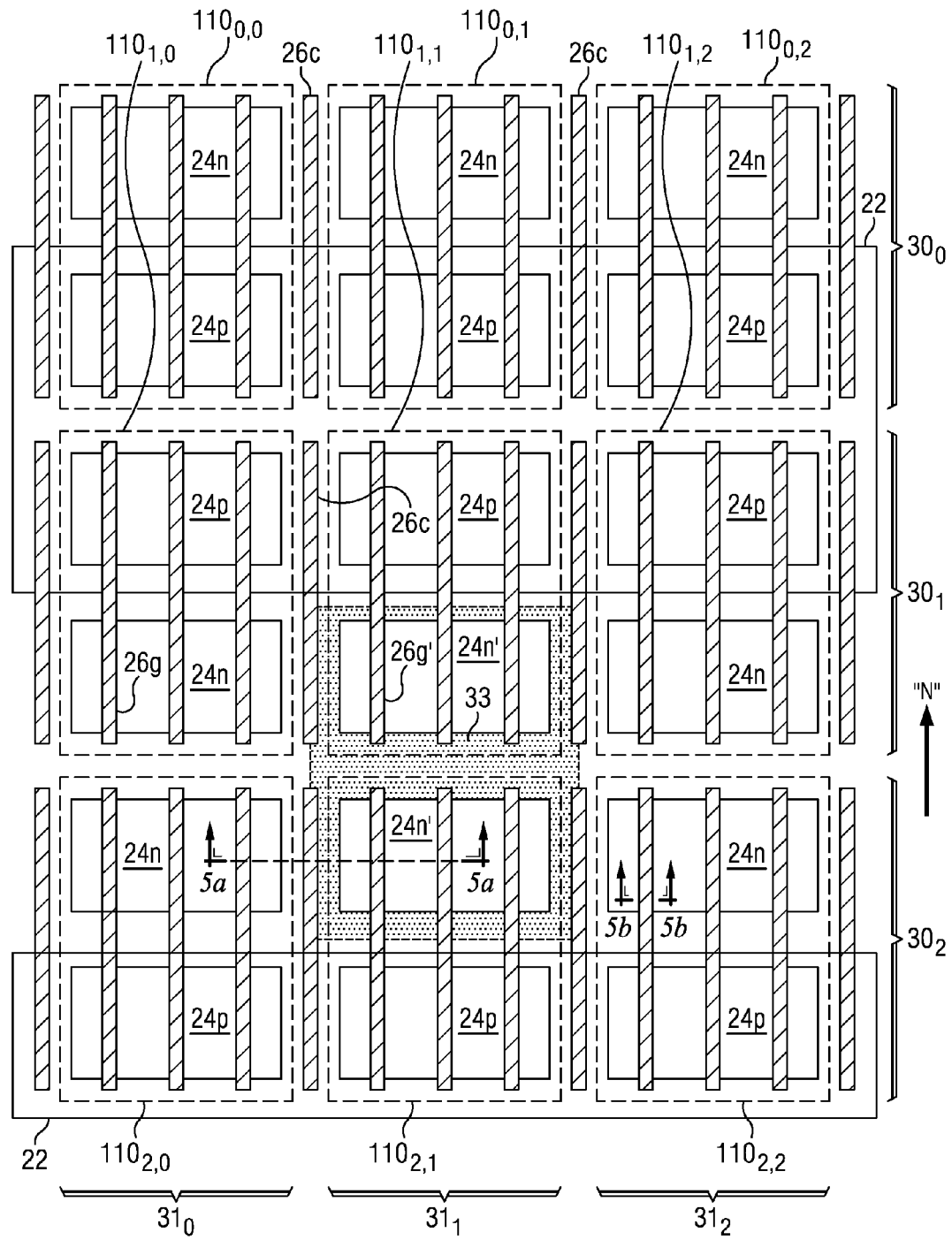
FIG. 3 is a plan view of a block-oriented integrated circuit constructed according to embodiments of this invention.

FIG. 3 illustrates a layout of logic blocks 110 in a portion of ASIC 100 according to an embodiment of the invention realized by CMOS technology. In this arrangement, logic blocks 110 are realized in three rows $30_0$ through $30_2$ and three columns $31_0$ through $31_2$. Of course, fewer or more logic blocks 110 than this three-by-three array can be used. In addition, logic blocks 110 may include more or fewer potential transistors than that shown in FIG. 3. In this CMOS arrangement, each logic block 110 includes a p-type active region 24p and an n-type active region 24n, with multiple polysilicon gate elements 26g extending parallel to one another in one direction (e.g., "north-south" in the view of FIG. 3) across both of its active regions 24p, 24n, thus providing shared gates between the n-channel and p-channel MOS transistors formed in those active regions 24p, 24n. The particular connection and defining of transistors within each logic block 110 will be determined by higher conductor levels than those shown in FIG. 3, for example by way of overlying metal conductors making electrical contact to the structures of FIG. 3 through contact openings and vias through overlying insulator layers, in the conventional manner.

P-type active regions 24p are disposed within respective n-wells 22, with p-type active regions 24p in the same row 30, and also the p-type active regions 24p in an adjacent row 30 disposed in the same instance of n-well 22. In this single-well realization, n-type active regions 24n are formed into the surface of a p-type substrate; alternatively, in a twin-well realization, p-type wells would be formed into the substrate, within which n-type active regions 24n would be disposed. In any case, active regions 24p, 24n shown in FIG. 3 correspond to regions of the surface of the integrated circuit chip at which transistors are formed, and are separated from one another by dielectric isolation structures such as shallow trench isolation structures. The conductivity type (i.e., n-type or p-type) of these active regions 24p, 24n, in this example, refer to the conductivity type after source/drain implant and anneal, which is performed after the formation of gate electrodes 26g, in the conventional manner. As such, the conductivity type of these active regions 24p, 24n will be different at locations under gate electrodes 26g; for example, the portions of active region 24p not covered by gate electrode 26g will be p-type, while the portion of active region 24p underlying gate electrode 26g will be n-type (i.e., at the dopant concentration of n-well 22). It is contemplated that those skilled in the art having reference to this specification will readily comprehend this construction of logic blocks 110 as shown in FIG. 3.

As evident from FIG. 3, logic blocks 110 are separated from their neighbors in the same row 30 by polysilicon elements 26c that overlie adjacent isolation structures. For example, a polysilicon element 26c is disposed between logic blocks $110_{1,0}$ and $110_{1,1}$, and also between logic blocks $110_{1,1}$ and $110_{1,2}$, in row $30_1$. The gate level structures of gate electrodes 26g and polysilicon elements 26c are simultaneously patterned from the same polysilicon layer, according to embodiments of this invention. Polysilicon elements 26c have a similar width and spacing, relative to neighboring gate electrodes 26g, as gate electrodes 26g have relative to one another within a logic block 110. This regularity in parallel gate level structures 26g, 26c assists in maintaining uniformity in the photolithographic patterning and etching of gate electrodes 26g, as known in the art. As described above in connection with FIGS. 1a and 1b, this regularity is enforced in integrated circuit 100 by constraining the pitch (i.e., spacing plus width) of parallel gate level structures 26g, 26c to within a relatively close range (i.e., at a substantially constant pitch) within this region of integrated circuit 100. The dimensions of this pitch constraint generally depends on the scale of the manufacturing technology, and also on the photolithography capability. In an example of deep submicron process technology at the 28 nm "node" (i.e., referring to nominal transistor channel length, or gate width), the pitch of gate level structures 26g, 26c may be constrained substantially constant, ranging from between about 114 nm to about 128 nm, minimizing undesired variation in the resulting structures.

Figure 1A:
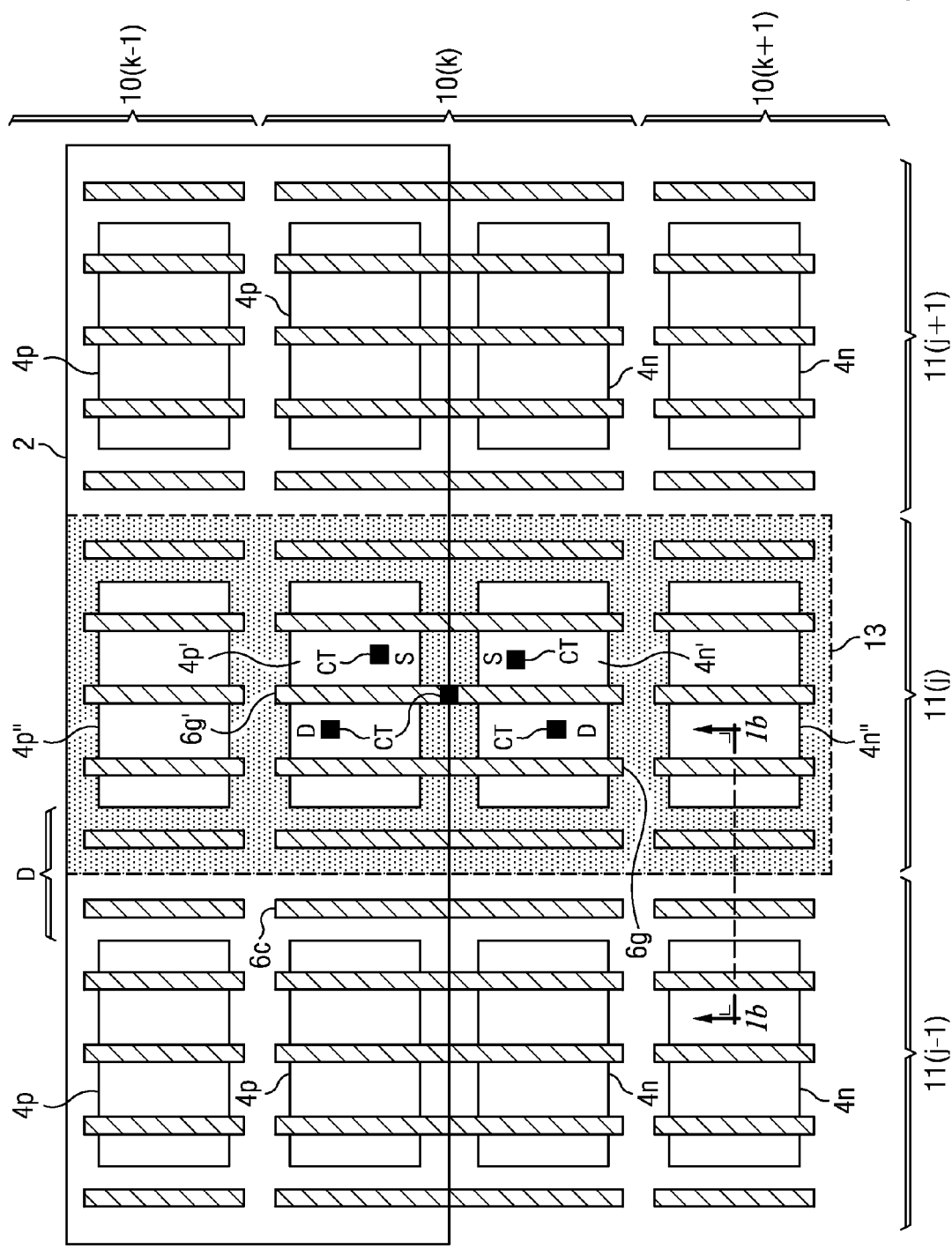
FIGS. 1a and 1b are plan and cross-sectional views, respectively, of a conventional block-oriented integrated circuit.
Figure 1B:
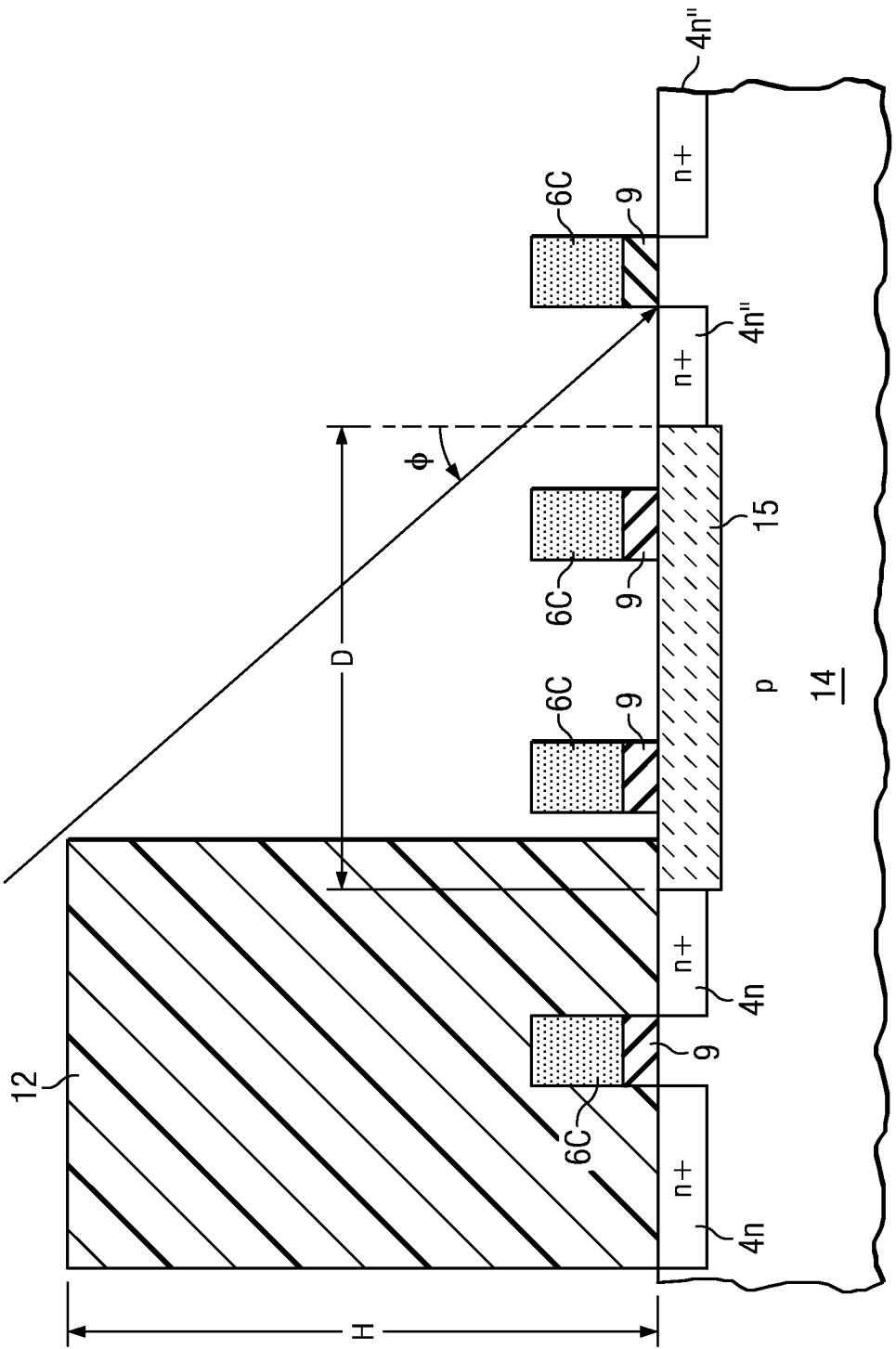

A comparison of FIG. 3 to the similar conventional arrangement of FIG. 1a shows that the spacing between adjacent columns 31 of logic blocks 110 is much closer than that of the conventional approach of FIG. 1a. Specifically, according to this embodiment of the invention, the distance required between logic blocks 110 is reduced to such an extent that the spacing between the nearest gate electrodes 26g in adjacent logic block columns 31 can fall within two pitch intervals of gate level structures 26g, 26c, requiring only a single polysilicon element 26c to be placed between adjacent logic blocks 110. In contrast, as shown in the conventional example of FIG. 1 a, the necessary spacing exceeds two pitch intervals, requiring the placement of two polysilicon elements 6c in that space. According to embodiments of this invention, as will now be described in detail, the close spacing in the arrangement of FIG. 3 is available while allowing specific active regions 24p, 24n and logic blocks 110 to have transistors of different threshold voltages than in adjacent regions and blocks.

In the example shown in FIG. 3, active regions 24n' in logic blocks $110_{1,1}$ and $110_{2,1}$ are fabricated to contain low threshold voltage (low-$V_t$) n-channel transistors, while adjacent active regions 24n in neighboring logic blocks $110_{1,0}$, $110_{1,2}$, $110_{2,0}$, $110_{2,2}$ are formed to contain standard threshold voltage n-channel transistors (i.e., having higher threshold voltages than the low-$V_t$ devices in active regions 24n'). In this example, the p-channel active regions 24p in logic blocks $110_{1,1}$ and $110_{2,1}$ and associated with active regions 24n' contain standard $V_t$ p-channel transistors, although these devices may also be formed as low-$V_t$ transistors if desired, according to embodiments of this invention. As known in the art, and as described above, the low threshold voltage of the transistors in active regions 24n' is set by way of an additional $V_t$ adjust implant (i.e., "pocket" implant) performed after formation of gate electrodes 26g. For this case, in which the $V_t$ of n-channel transistors is being adjusted lower, this $V_t$ adjust implant is accomplished by implanting n-type dopant (e.g., phosphorous, arsenic) ions into the channel region underlying gate electrode 26g in active regions 24n'. The ability of embodiments of this invention to define and implement active regions 24 for receipt of this pocket implant, yet maintain close spacing with adjacent active regions 24 that do not receive the implant, results from the particular manner in which the implant is carried out, as will now be described.

Figure 4:
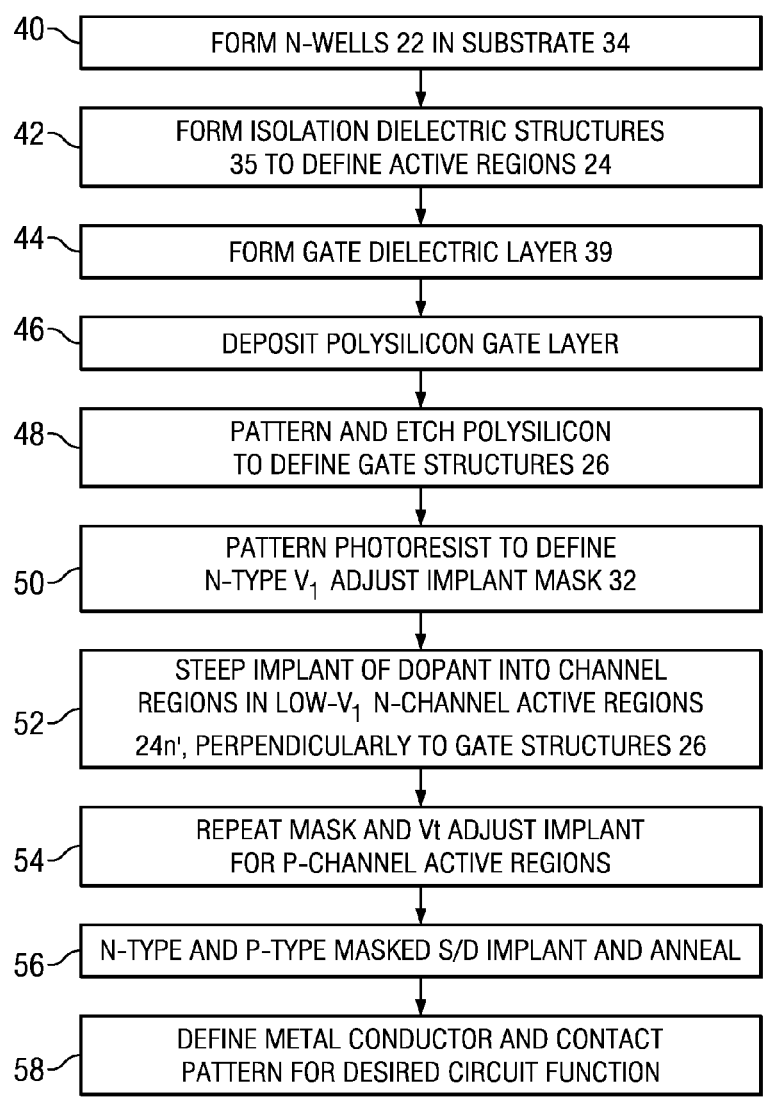
FIG. 4 is a flow diagram illustrating a method of fabricating the integrated circuit of FIG. 2, according to embodiments of this invention.

FIG. 4 illustrates a generalized manufacturing flow for the fabrication of ASIC 100 including logic blocks 110 according to embodiments of this invention. As will be evident to those skilled in the art having reference to this specification, many alternatives to this flow can be used in connection with embodiments of this invention, such alternatives including the addition of various processes and operations and also changes in the sequence of those processes. As such, the process flow of FIG. 4 is provided by way of example only, and to provide context to the detailed description of embodiments of this invention provided herein.

In this example, fabrication of ASIC 100 begins with process 40 in which n-wells 22 are formed at selected locations of the surface of a p-type substrate, which may be a single-crystal silicon wafer of the desired conductivity type and dopant concentration, a single-crystal layer of silicon overlying an insulator layer disposed on a handle wafer (according to conventional silicon-on-insulator technology), or an alternative starting material to these typical substrate structures. Process 40 is carried out in the conventional manner. For a double-well process, p-type wells would be similarly formed at locations apart from those of n-wells 22. In process 42, isolation dielectric structures are formed at selected locations of the surface of the substrate, both within and outside of n-wells 22 in this example. In modern integrated circuits, these isolation dielectric structures are formed using shallow trench isolation techniques; alternatively, local oxidation of silicon (LOCOS) isolation oxide can be thermally formed. As known in the art, those locations of the surface of the substrate at which isolation dielectric structures are not formed will become active regions 24p, 24n, at which transistors will eventually be formed.

In process 44, a gate dielectric layer is formed over the active regions defined by the isolation dielectric structures resulting from process 42. This gate dielectric layer may be silicon dioxide, formed by thermal oxidation of the exposed silicon in these active regions or by deposition, deposited silicon nitride, a combination or stack of silicon dioxide and silicon nitride, or such other transistor gate dielectric material as known in the MOS transistor art. Polycrystalline silicon is then deposited overall, and photolithographically patterned and etched, in process 48, to define the gate level structures of gate electrodes 26g overlying active regions 24p, 24n and polysilicon elements 26c overlying the isolation dielectric structures at the surface of ASIC 100, including the portion thereof shown in FIG. 3. The pitch of these gate level structures 26g, 26c is maintained substantially constant, i.e., constrained to within a narrow range, in this region of ASIC 100, as described above.

In process 50, photoresist is deposited onto the surface of the structure, exposed, and developed, to define a mask for a $V_t$ adjust implant (process 52) into those active regions 24n' at which low-$V_t$ transistors are to be constructed. According to embodiments of this invention, the manner in which this masking layer is formed in combination with the manner in which the $V_t$ adjust implant is carried out, enables the close placement of low-$V_t$ active regions 24n' with adjacent standard $V_t$ active regions 24n, using the example of FIG. 3. The particulars of these processes 50, 52 will now be described in connection with FIGS. 5a and 5b.

Figure 5A:
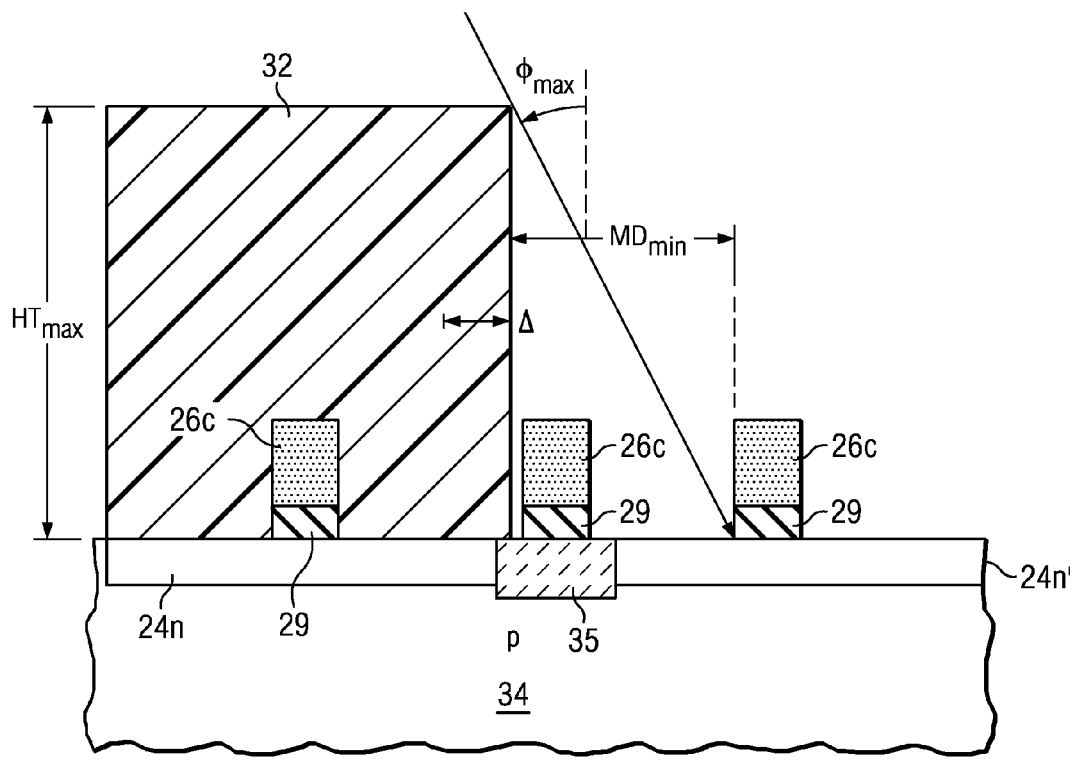
FIGS. 5a and 5b are cross-sectional views of the integrated circuit of FIG. 2, according to embodiments of this invention.

FIG. 5a illustrates, in cross-section, a portion of the surface of the integrated circuit chip at which logic blocks 110 are being formed, at the point in the manufacturing process at which the $V_t$ adjust implant into the low-$V_t$ active regions (i.e., logic blocks $110_{1,1}$ and $110_{2,1}$) is being performed in process 52, after the formation of photoresist mask 32 in process 50. In this FIG. 5a, and at this point in the process, isolation dielectric structures 35 are disposed at selected locations of the surface of p-type substrate 34, defining the locations of active regions 24. The gate level structures of polysilicon elements 26c and gate electrodes 26g have been defined (processes 46, 48), and overlie gate dielectric 29 at the desired locations of active regions 24n, 24n' (as well as over active regions 24p, not shown). Active regions 24n, 24n' are not yet necessarily doped n-type (but are in fact p-type material at this point, in this example of the process flow), because source/drain implant has not yet occurred.

The $V_t$ adjust implant is to be subjected to the portion of active region 24n' underlying its gate electrodes 26g, which will become the channel region of transistors gated by those gate electrodes 26g. As known in the art, this implant changes the net dopant concentration in the transistor channel, which in turn changes the threshold voltage of the eventual transistor. Implant of n-type dopant species at that location (which is otherwise typically lightly-doped p-type) reduces the net dopant concentration of the p-type material, which reduces the gate voltage required to invert the channel region under gate electrode 26g, as exhibited by a reduced threshold voltage.

FIG. 5a illustrates the position of implant mask 32 overlying active region 24n, but exposing active region 24n'. Of course, implant mask 32 will also cover eventual p-type active regions 24p, to also protect those regions from the $V_t$ adjust implant for active regions 24n'. In this embodiment of the invention, the height (i.e., vertical thickness) of mask layer 32 formed in process 50 is limited to a maximum height $HT_{max}$, and the distance of its closest edge is limited to a minimum distance $MD_{min}$ from the nearest edge of the nearest gate electrode 26g in active region 24n' that is to receive the implant. It is contemplated that there will be a nominal position of the closest edge of mask 32 that is slightly more distant from gate electrode 26g, such that the process variation $\Delta$ of the edge of mask layer 32 from that nominal location will not violate the minimum distance $MD_{min}$. The minimum distance $MD_{min}$ is contemplated to be quite small, which enables close spacing of standard $V_t$ active region 24n to low $V_t$ active region 24n'.

The dimensions $HT_{max}$ and $MD_{min}$ that define the height and position of mask layer 32 in turn define a maximum angle $\phi_{max}$ from the vertical of the tilt at which the $V_t$ adjust implant is to be performed. As evident from FIG. 5a, if the angle of the implant exceeds this maximum angle $\phi_{max}$, the corner of mask layer 32 will block (i.e., "shadow") the implant from reaching the channel region underlying the nearest gate electrode 26g. This maximum angle $\phi_{max}$ in this embodiment of the invention is likely to be constrained from that conventionally used for the $V_t$ adjust implant, but of course must be a sufficient angle from the vertical to effectively implant dopant into the channel region underlying gate electrode 26g. For example, it is contemplated that the minimum angle necessary for an effective $V_t$ adjust implant is 20° from the vertical, and a suitable maximum angle $\phi_{max}$ is contemplated to be on the order of 30° from the vertical.

Figure 5B:
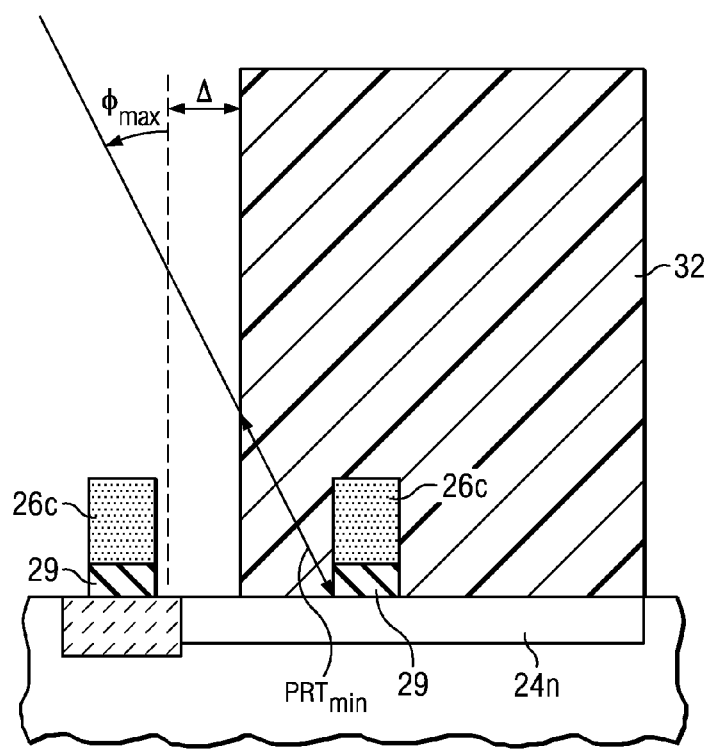

In addition to the geometry shown in FIG. 4a, another constraint is the necessary thickness of mask layer 32 to protect transistors in the adjacent standard $V_t$ active region 24n from receiving the implant intended for low-$V_t$ active region 24n. FIG. 5b illustrates this constraint, by way of gate structure 26g in active region 24n of logic block $110_{2,2}$ (FIG. 3). In this situation, the edge of mask layer 32 is positioned at its closest permitted location, relative to the edge of gate structure 26g in active region 24n, as evident by its location at the extreme right-hand side of process variation $\Delta$. At this closest permitted location, and considering the maximum angle $\phi_{max}$ of the implant, a minimum photoresist thickness $PRT_{min}$ is defined. This minimum thickness $PRT_{min}$ is selected to be sufficient to block the implanted dopant ions, for the specified energy of the $V_t$ adjust implant in process 52.

An example of the dimensions involved in the structures of FIGS. 5a and 5b will be instructive in describing a realistic integrated circuit in which an embodiment of this invention is workable. For the example in which the nominal width of gate electrodes 26g and polysilicon structures 26c is about 36 nm, a maximum photoresist height $HT_{max}$ of about 160 nm can be used for mask layer 32, for the case in which the $V_t$ adjust implant angle ranges from a minimum of 20° from the vertical to a maximum angle $\phi_{max}$ of about 30° from the vertical. These parameters can yield a minimum distance $MD_{min}$ of about 126 nm from the nearest edge of gate electrode 26g in the implanted active region 24n' to the closest edge of mask layer 32. With a permissible process variation $\Delta$ of about +/−22 nm, this geometry provides a minimum photoresist thickness $PRT_{min}$ of about 30 nm at the nearest masked gate electrode 26g, which is believed adequate to block typical $V_t$ adjust ion implantation.

Because minimum distance $MD_{min}$ is sufficiently small according to this embodiment of the invention, the spacing between the nearest gate electrodes 26g in active region 24n' containing low-$V_t$ transistors and its adjacent active region 24n containing standard-$V_t$ transistors can be held to less than two pitch intervals P of polysilicon structures 26c, 26g, as shown in FIG. 5a. As such, only a single instance of polysilicon structure 26c is required between these adjacent logic blocks 110 of different threshold voltage transistors, as evident from FIGS. 3 and 5a.

According to this embodiment of the invention, additional control of this $V_t$ adjust implant is provided by constraining the direction of the implant of process 52 to that which is substantially perpendicular to the longitudinal direction of gate electrodes 26g in the implanted active regions 24'. In the layout of FIG. 3, the tilt of the implant of process 52 will be largely in a "east-west" orientation, as gate electrodes 26g run "north-south". This orientation of the $V_t$ adjust implant ensures efficient and uniform proper threshold voltage adjustment where desired, while allowing the close spacing between logic blocks 110 described above.

As described above, therefore, the $V_t$ adjust implant of process 52 is a relatively steep implant, carried out generally in a perpendicular direction relative to the run of gate electrodes 26g in active regions 24n' that are to be constructed with low-$V_t$ transistors. Mask layer 32 is then removed from the surface of the structure, in the conventional manner. As described above, processes 50, 52 pertain to n-channel transistor active regions 24n'. If low-$V_t$ p-channel transistors are to be formed in any of active regions 24p of logic blocks 110, similar mask and implant processes are repeated for those devices, in process 54. Of course, the mask pattern for the corresponding instance of mask layer 32, and the dopant species (and perhaps dose, energy, etc.) of the $V_t$ adjust implant, will be modified accordingly in this process 54, relative to the n-channel case.

In this example of the fabrication of ASIC 100, conventional additional processing is then performed. Referring back to FIG. 4, this additional processing includes the ion implant and subsequent activation anneal of the source/drain regions in active regions 24p, 24n, 24n', performed in process 56. As typical in the art, doping of these source/drain regions is performed in a self-aligned manner relative to gate electrodes 26g; sidewall spacers and other similar techniques can be used to create drain extension regions or graded junctions, as known in the art. The activation anneal for the source/drain implant may also be used to activate the $V_t$ adjust implant; alternatively, an anneal of the $V_t$ implant may be performed separately, prior to the source/drain implant, if desired. In process 56, the formation of contact openings through overlying insulator layers to contact gate electrodes 26g and active regions 24 (e.g., as shown in FIG. 1a), and also the deposition and patterning of the desired metal conductor routing into those contact openings and elsewhere in ASIC 100, is performed. This conductor routing and contact definition of course defines the circuit functions to be carried out by logic blocks 110, in this ASIC 100.

Other processes and operations useful in the fabrication of actual integrated circuits, as known in the art, will be performed at the appropriate stages in this fabrication flow, and will be apparent to those skilled in the art having reference to this specification.

Figure 6A:
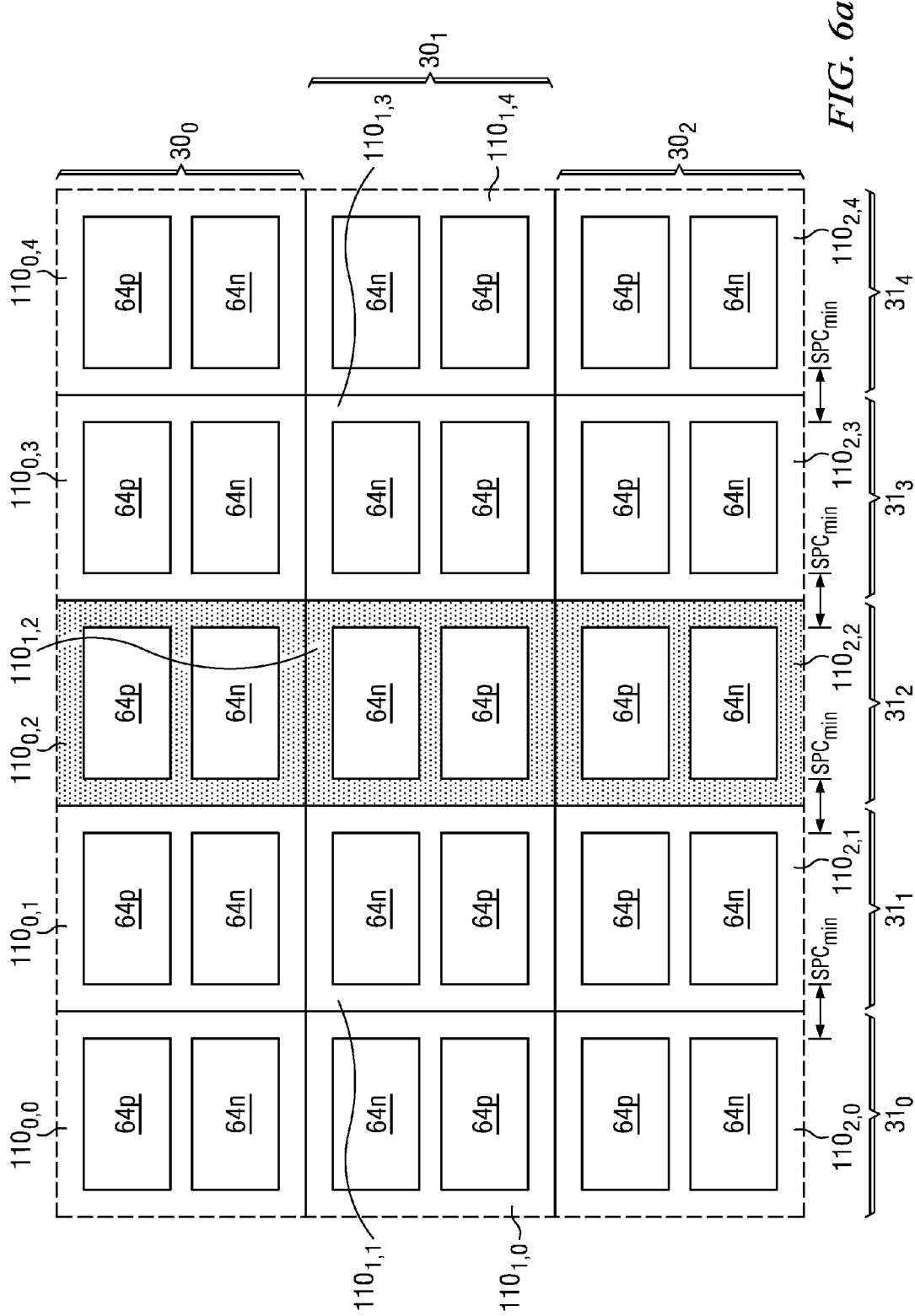
FIGS. 6a through 6c are plan views of block-oriented integrated circuits constructed according to embodiments of this invention.
Figure 6B:
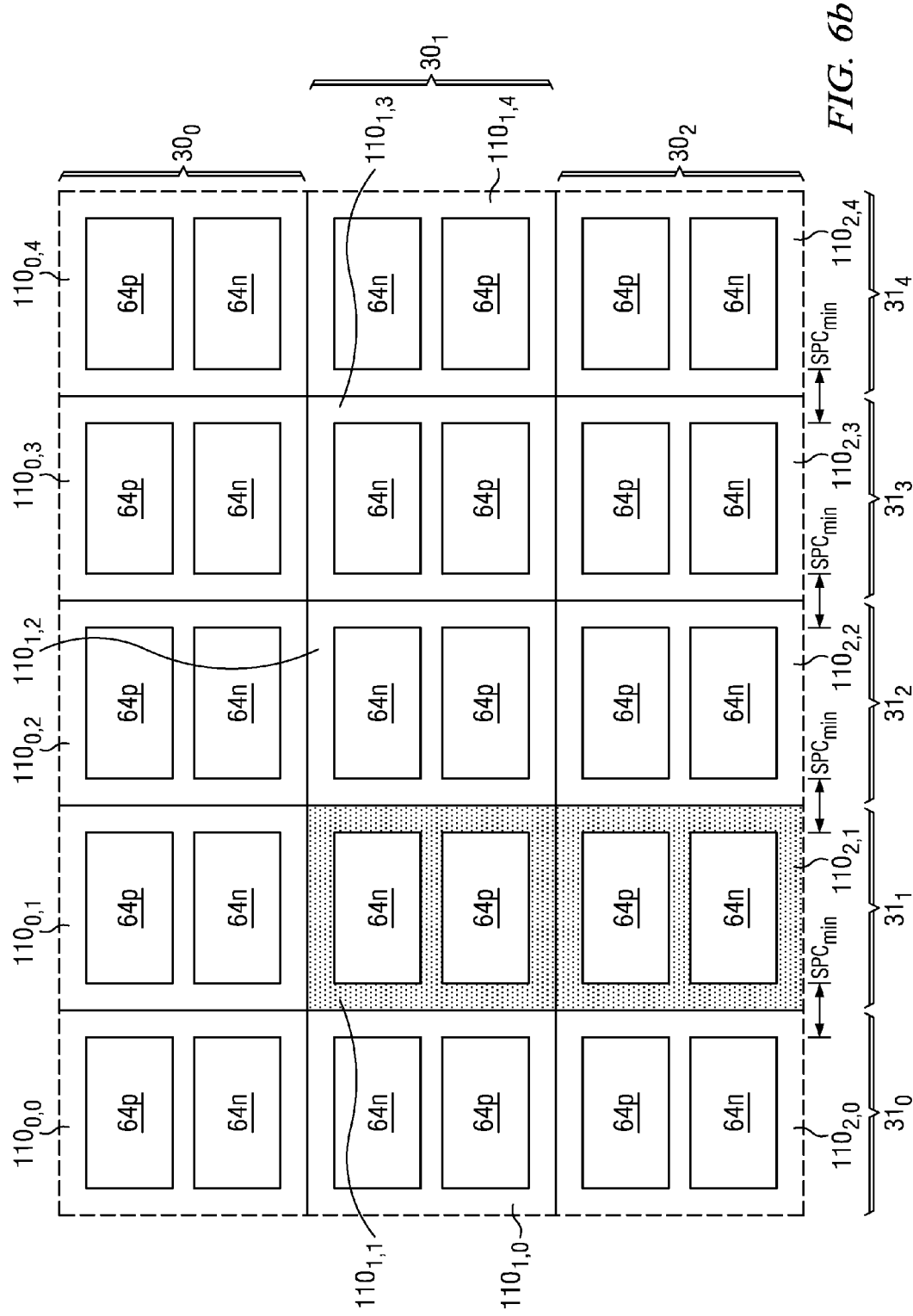
Figure 6C:
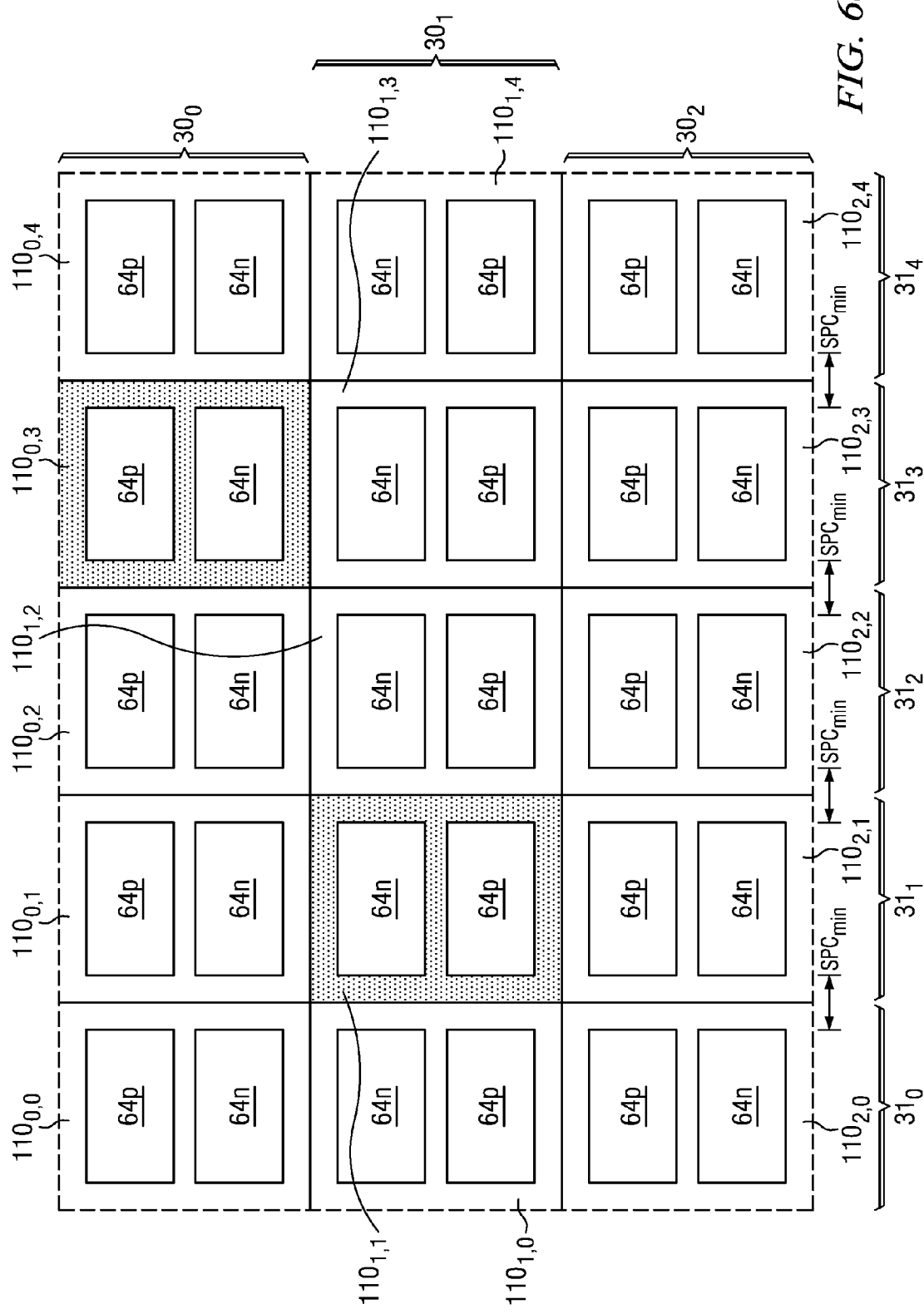

According to embodiments of this invention, as described above, the spacing between active regions of different threshold voltages can be minimized. It is contemplated that, in many cases, the spacing between different threshold voltage active regions need not be significantly wider than that between active regions of the same threshold voltage. Stated another way, logic blocks in an integrated circuit can be closely spaced in an array fashion without a priori determination of the eventual threshold voltage of the transistors. FIGS. 6a through 6c illustrate examples of such an integrated circuit showing varied placement of low threshold voltage regions.

FIG. 6a is a plan view of a portion of a CMOS integrated circuit such as

ASIC 100. In the portion shown in FIG. 6a, an array of logic blocks 110 are arranged in three rows $30_0$ through $39_2$ and five columns $31_0$ through $31_4$. Each logic block 110 includes n-channel active region 64n and p-channel active region 64p, formed in the manner described above. Wells and gate electrodes are present in this construction, but are not shown in FIG. 6a for the sake of clarity; in this arrangement, gate electrodes and corresponding polysilicon elements between logic blocks 110 have substantially a constant width and spacing, and run "north-south" in the arrangement of FIG. 6a as described above.

As shown in FIG. 6a, active regions 64n, 64p in each of logic blocks 110 are separated from their nearest neighboring active regions 64n, 64p in the column direction by minimum spacing $SPC_{min}$. As shown in FIG. 6a, this minimum spacing $SPC_{min}$ is identical between each pair of adjacent columns 31. Even with this uniform spacing $SPC_{min}$ in the arrangement of FIG. 6a, low $V_t$ logic blocks $110_{0,2}$, $110_{1,2}$, $110_{2,2}$ within column $31_2$ receive the $V_t$ adjust implant as described above in FIGS. 4, 5a, and 5b. If both n-type active regions 64n and p-type active regions 64p in these logic blocks $110_{0,2}$, $110_{1,2}$, $110_{2,2}$ are to be formed with low-$V_t$ devices, then two separate masked $V_t$ adjust implants will be applied, one for each conductivity type. Conversely, logic blocks 110 in column $31_0$, $31_1$, $31_3$, $31_4$ are standard (i.e., higher) $V_t$ logic blocks, and as such are masked from the $V_t$ adjust implant(s) applied to logic blocks 110 in column $31_2$. As mentioned above, additional spacing between columns 31 is not necessary to construct logic blocks 110 in column $31_2$ as low $V_t$ transistors, for the reasons described above in connection with embodiments of this invention.

FIG. 6b illustrates another implementation of the integrated circuit including the array of logic blocks 110 are arranged in three rows $30_0$ through $39_2$ and five columns $31_0$ through $31_4$. The construction of logic blocks 110 as arranged in FIG. 6b is essentially identical with that of FIG. 6a at the lower levels of wells, isolation structures, active regions 64n, 64p, and the polysilicon (gate) levels; the higher levels of metal and contact may differ between the embodiments of FIGS. 6a and 6b, depending on the desired circuit function to be realized. And as in the case of FIG. 6a, active regions 64n, 64p are separated from one another in the column direction by minimum spacing $SPC_{min}$.

However, in the case shown in FIG. 6b, logic blocks $110_{1,1}$, $110_{2,1}$ include low $V_t$ active regions 64n, 64p, while all other logic blocks 110 shown (i.e., logic block $110_{0,1}$ and logic blocks 110 in columns $31_0$, $31_2$, $31_3$, $31_4$) include standard $V_t$ active regions 64n, 64p. These low $V_t$ logic blocks $110_{1,1}$, $110_{2,1}$ are defined by way of a $V_t$ adjust implant carried out according to embodiments of this invention such as described above, for either or both of n-type active regions 64n and p-type active regions 64p. As evident in FIG. 6b (as well as in FIG. 3 described above), the spacing required between standard $V_t$ logic block $110_{0,1}$ and low $V_t$ logic block $110_{1,1}$ (in the same column $31_1$) in the row direction is no different than that between standard $V_t$ logic blocks 110, according to embodiments of this invention.

FIG. 6c again illustrates a portion of an integrated circuit such as ASIC 100 in which the array of logic blocks 110 are arranged in three rows $30_0$ through $39_2$ and five columns $31_0$ through $31_4$. The construction of logic blocks 110 as arranged in FIG. 6b is essentially identical with that of FIGS. 6a and 6b at the lower levels of wells, isolation structures, active regions 64n, 64p, and the polysilicon (gate) levels; the higher levels of metal and contact may differ depending on the desired circuit function to be realized. In the case of FIG. 6c, non-adjacent logic blocks $110_{0,3}$, $110_{1,1}$ receive the $V_t$ adjust implant to either or both of their n-type and p-type active regions 64n, 64p, respectively, and as such constitute low $V_t$ logic blocks, while the other logic blocks 110 are masked from receiving the $V_t$ adjust implant(s) and thus contain standard (higher) threshold voltage transistors. Again, the spacing of active regions 64n, 64p in the row and column directions need not differ for implementation of the low $V_t$ devices in this arrangement.

Of course, many other selections and arrangements of logic blocks 110 to include low $V_t$ or standard $V_t$ transistors may be realized according to these embodiments of the invention. It is contemplated that those skilled in the art, having reference to this specification, will also recognize that more than two threshold voltages per channel conductivity type can be realized in a single integrated circuit, at a cost of further complicating the process flow, considering the additional mask patterns required.

These examples of FIGS. 6a through 6c exemplify the flexibility of integrated circuits constructed according to embodiments of this invention, because the layout of active regions, isolation structures, and gate level electrodes and structures does not depend on knowledge of which regions of the integrated circuit are to be constructed as low $V_t$ regions and which are to be constructed as standard $V_t$ regions. Assignment of low $V_t$ transistors can thus be made later in the manufacturing timeline, including as based on the characterization and operation of actual integrated circuits, because the only photomasks required for changing the low $V_t$ designation are those for masking the $V_t$ adjust implant. This flexibility is obtained, according to embodiments of this invention, while still conserving chip area, because of the minimum spacing attainable according to this invention. The performance versus speed design window for integrated circuits constructed according to embodiments of this invention is thus much wider than for conventional implementations.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit at a semiconducting surface of a body, comprising:
    forming a plurality of isolation structures at the surface to define first and second active regions of a first conductivity type at the surface, the first and second active regions separated from one another by a first isolation structure;
    forming a plurality of gate level structures comprising a plurality of gate electrodes disposed parallel to one another at locations overlying the first and second active regions, and disposed at substantially a constant pitch relative to one another;
    forming a first mask layer over the surface, the first mask layer exposing the first active region at the location of a first gate electrode nearest the first isolation structure, and covering at least a portion of the second active region, the first mask layer having a thickness below a maximum height;
    implanting dopant ions into the first active region at an angle from the vertical less than a maximum angle; and
    then removing the first mask layer;
    wherein the first gate electrode is parallel to a second gate electrode overlying the second active region at a location nearest the first isolation structure, and said plurality of gate structures further comprises a single gate structure disposed overlying the first isolation structure between the first and second active regions, so that the first gate electrode is the nearest gate electrode in the first active area to the single gate structure overlying the first isolation structure, and the second gate electrode is the nearest gate electrode in the second active area to the single gate structure overlying the first isolation structure, and the single gate structure overlying the first isolation structure is at substantially the constant pitch relative to the first gate electrode and the second gate electrode.

2. The method of claim 1, wherein the maximum angle is about 30° from the vertical.

3. The method of claim 2, wherein the implanting step is performed at an angle from the vertical greater than 20°.

4. The method of claim 2, wherein the plurality of gate level structures further comprises:
    a third gate electrode at a third active region of the first conductivity type at the surface, the third active region neighboring the first active region on an opposite side from the second active region, and separated therefrom by a second isolation structure; and
    and a second single instance of said gate structures overlying said second isolation structure, parallel to said first gate electrode and to said third gate electrode, so that said first gate electrode, said third gate electrode and said gate electrode overlying said second isolation structure are at substantially the constant pitch;
    wherein the first mask layer also covers the third active region;
    and wherein the first mask layer at the third active region has an edge disposed at a location between the third gate electrode and the first active region so that the first mask layer operates to block dopant ions implanted by the implanting step from reaching the third active region underlying the third gate electrode.

5. The method of claim 4, further comprising:
    forming a second mask layer over the surface, the second mask layer exposing the third active region at the location of the third gate electrode, and covering at least a portion of the first active region, the second mask layer having a thickness below a maximum height;
    implanting dopant ions into the third active region at an angle from the vertical less than a maximum angle; and
    then removing the second mask layer.

6. The method of claim 4, further comprising:
    forming a fourth active region of a second conductivity type at the surface, the fourth active region neighboring the first active region and separated therefrom by a third isolation structure;
    wherein the second and third active regions are on opposite sides of the first active region;
    and wherein the fourth active region is disposed on a third side of the first active region.

7. The method of claim 6, wherein the first gate electrode extends over the first active region and the fourth active region.

8. The method of claim 1, wherein the implanting step implants the dopant ions in a direction substantially perpendicular to the first gate electrode at the first active region.

9. The method of claim 1, wherein the constant pitch is at or below 128 nm.

10. The method of claim 9, wherein the pitch of adjacent gate structures ranges from 114 nm to 128 nm.

11. An integrated circuit, comprising:
    a plurality of isolation structures at a semiconducting surface of a body, the isolation structures defining first and second active regions of a first conductivity type at the surface, the first and second active regions separated from one another by a first isolation structure;
    a plurality of gate level structures comprising a plurality of gate electrodes disposed parallel to one another at locations overlying the first and second active regions, and disposed at substantially a constant pitch of 128 nm or less relative to one another, the plurality of gate level structures including:
        a first gate electrode of the plurality of gate electrodes over the first active region nearest the first isolation structure, wherein the first gate electrode forms part of a first transistor having a low threshold voltage;
        a second gate electrode of the plurality of gate electrodes over the second active region nearest the first isolation structure, wherein the second gate electrode forms part of a second transistor having a threshold voltage higher than the first transistor;
        a third gate electrode of the plurality of gate electrodes over the first active region;
        a fourth gate electrode of the plurality of gate electrodes over the second active region; and
        a first gate level structure over the first isolation structure between the first gate electrode and the second gate electrode.

12. A method of fabricating an integrated circuit, comprising the steps of:
    forming a plurality of isolation structures at a surface of a semiconductor body to define first and second active regions of a first conductivity type at the surface, the first and second active regions separated from one another by a first isolation structure;

forming a plurality of gate level structures comprising a plurality of gate electrodes disposed parallel to one another at locations overlying the first and second active regions, and disposed at substantially a constant pitch relative to one another, the plurality of gate level structures including:
- a first gate electrode of the plurality of gate electrodes disposed over the first active region nearest the first isolation structure;
- a second gate electrode of the plurality of gate electrodes over the second active region nearest the first isolation structure;
- a third gate electrode of the plurality of gate electrodes over the first active region;
- a fourth gate electrode of the plurality of gate electrodes over the second active region; and
- a first gate level structure over the first isolation structure between the first gate electrode and the second gate electrode;

forming a first mask layer over the surface, the first mask layer exposing the first active region at the location of the first gate electrode, and covering at least a portion of the second active region, the first mask layer having a thickness below a maximum height;

performing a threshold adjust implant of dopant ions into the first active region at an angle from the vertical less than a maximum angle without implanting under the second gate electrode; and then removing the first mask layer.

13. The method of claim 12, wherein the maximum angle is about 30° from the vertical.

14. The method of claim 13, wherein the implanting step is performed at an angle from the vertical greater than 20°.

* * * * *